(12) United States Patent
Hong et al.

(10) Patent No.: US 9,685,488 B2
(45) Date of Patent: Jun. 20, 2017

(54) ORGANIC LIGHT EMITTING DISPLAY DEVICE AND METHOD OF MANUFACTURING THE SAME

(71) Applicant: Samsung Display Co., Ltd., Yongin, Gyeonggi-Do (KR)

(72) Inventors: Sang-Min Hong, Cheonan-si (KR); Yong-Kyu Jang, Hwaseong-si (KR); Hyun-Min Hwang, Cheonan-si (KR); Hyun-Young Kim, Asan-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 49 days.

(21) Appl. No.: 14/534,422

(22) Filed: Nov. 6, 2014

(65) Prior Publication Data

US 2015/0243711 A1    Aug. 27, 2015

(30) Foreign Application Priority Data

Feb. 21, 2014   (KR) ..................... 10-2014-0020338

(51) Int. Cl.
| | |
|---|---|
| *H01L 27/32* | (2006.01) |
| *H01L 51/52* | (2006.01) |
| *H01L 51/56* | (2006.01) |
| *H01L 51/00* | (2006.01) |

(52) U.S. Cl.
CPC ........ *H01L 27/323* (2013.01); *H01L 27/3253* (2013.01); *H01L 51/5246* (2013.01); *H01L 51/56* (2013.01); *H01L 51/0024* (2013.01); *H01L 2227/323* (2013.01)

(58) Field of Classification Search
CPC ... H01L 27/323; H01L 51/56; H01L 51/5246; H01L 51/0024; H01L 2227/323
See application file for complete search history.

(56) References Cited

U.S. PATENT DOCUMENTS

| | | | |
|---|---|---|---|
| 7,531,847 B2 * | 5/2009 | Shitagaki et al. | ............ 257/100 |
| 2011/0115365 A1 * | 5/2011 | Kwak | ............................ 313/317 |
| 2011/0134056 A1 | 6/2011 | Kim et al. | |
| 2011/0216018 A1 * | 9/2011 | Kim | ........................ G06F 3/041 345/173 |
| 2012/0048462 A1 | 3/2012 | Lee | |
| 2012/0105344 A1 * | 5/2012 | Ko et al. | ........................ 345/173 |
| 2012/0319574 A1 | 12/2012 | Kim et al. | |

FOREIGN PATENT DOCUMENTS

| | | |
|---|---|---|
| KR | 1020020042927 A | 6/2002 |
| KR | 10-2008-0001536 A | 1/2008 |
| KR | 10-2011-0020613 A | 3/2011 |

(Continued)

*Primary Examiner* — Daniel Luke
*Assistant Examiner* — Khatib Rahman
(74) *Attorney, Agent, or Firm* — Robert E. Bushnell, Esq.

(57) ABSTRACT

An organic light emitting display (OLED) device that includes a first substrate and a second substrate. An organic light emitting element and a sealing member are formed between the first substrate and the second substrate. A touch panel, a block pattern, and a protective layer are formed on the second substrate. The block pattern is arranged above the sealing member to prevent a center of the sealing member from being excessively illuminated by a laser beam during a curing process.

20 Claims, 14 Drawing Sheets

(56) References Cited

FOREIGN PATENT DOCUMENTS

| KR | 10-2011-0041321 A | 4/2011 |
| KR | 10-2011-0062469 A | 6/2011 |
| KR | 10-2012-0020942 A | 3/2012 |
| KR | 10-2012-0062178 A | 6/2012 |
| KR | 10-2012-0139075 A | 12/2012 |

* cited by examiner

ORGANIC LIGHT EMITTING DISPLAY DEVICE AND METHOD OF MANUFACTURING THE SAME

CLAIM OF PRIORITY

This application claims priority under 35 USC §119 to Korean Patent Applications No. 10-2014-0020338, filed on Feb. 21, 2014 in the Korean Intellectual Property Office (KIPO), the contents of which are incorporated herein in its entirety by reference.

BACKGROUND OF THE INVENTION

Field of the Invention

Example embodiments relate generally to an organic light emitting display (OLED) device and a method of manufacturing the OLED device.

Description of the Related Art

An organic light emitting display (OLED) device displays information including images and characters by using light generated when holes and electrons that are provided from an anode and a cathode, respectively are combined with each other at an organic light emitting layer interposed between the anode and the cathode. The OLED device has been spotlighted as next-generation display devices because the OLED device has various advantages such as a wide viewing angle, a rapid response speed, a thin thickness, low power consumption, etc. The OLED device may be divided into an emission region in which organic light emitting elements are arranged and a non-emission region. The non-emission region may include a region in which a peripheral circuit for controlling the organic light emitting elements is arranged and a sealing member for encapsulating the organic light emitting elements is arranged. The sealing member may attach a lower substrate and an upper substrate and may encapsulate the organic light emitting elements arranged within the emission region. In a curing process that attaches the lower substrate and the upper substrate, the sealing member may be heated and cured by a laser beam. A thermal energy generated by the laser beam may be concentrated at a center of the sealing member. When the thermal energy is concentrated on the center of the sealing member, the mechanical strength of the sealing member may be decreased because the thermal energy is not uniformly dispersed throughout the sealing member.

SUMMARY OF THE INVENTION

Some example embodiments provide an organic light emitting display (OLED) device of which mechanical strength of the sealing member are enhanced.

Some example embodiments provide a method of manufacturing the OLED device having enhanced mechanical strength.

According to one aspect of the present invention, there is provided an organic light emitting display (OLED) device that includes a first substrate including an emission region, a circuit region that surrounds the emission region, and a peripheral region that surrounds the circuit region, a second substrate facing the first substrate, an organic light emitting element arranged within the emission region of the first substrate, a sealing member arranged within the peripheral region of the first substrate and configured to bond together the first substrate and the second substrate upon being cured by a laser beam, a sensing cell arranged on the second substrate at a location that corresponds to the organic light emitting element, a conductive pattern arranged on the second substrate at a location that corresponds to the circuit region, a block pattern arranged on the second substrate at locations that correspond to the sealing member, the block pattern and the sealing member being arranged on all four sides of the emission region, the block pattern being configured to prevent central axes of the sealing member from receiving more laser radiation than other portions of the sealing member during a curing process by blocking a portion of incident laser radiation directed towards the central axes of the sealing member and a protective layer covering the sensing cell, the conductive pattern, and the block pattern on the second substrate.

A width of the block pattern may be smaller than a width of the sealing member. The block pattern may include a plurality of metal patterns, and the metal patterns may be spaced-apart from each other by a predetermined distance. The metal patterns may have a shape selected from polygonal and circular. The block pattern and the conductive pattern may be concurrently formed. The block pattern may also include an inorganic layer that covers the metal patterns, and a transmittance of the inorganic layer may be less than 90%. The block pattern may include a plurality of inorganic patterns, and the inorganic patterns may be spaced-apart from each other by a predetermined distance. The inorganic patterns may have a shape selected from polygonal and circular. The inorganic patterns may be formed by patterning an inorganic layer of which transmittance is less than 90%. The protective layer may include an inorganic layer through which light is transmitted.

According to another aspect of the present invention, there is provided a method of manufacturing an organic light emitting display (OLED) device, including preparing a first substrate that includes an emission region, a circuit region that surrounds the emission region, and a peripheral region that surrounds the circuit region, forming an organic light emitting element within the emission region of the first substrate, forming a sealing member within the peripheral region of the first substrate on all four sides of the emission region, preparing a second substrate, forming a sensing cell on the second substrate at a location that corresponds to the organic light emitting element, forming a conductive pattern on the second substrate at a location that corresponds to the circuit region, forming a block pattern on the second substrate at a location that corresponds to the sealing member on all four sides of the emission region, forming a protective layer on the second substrate to cover the sensing cell, the conductive patter, and the block pattern, arranging the second substrate to face the first substrate and bonding together the first substrate and the second substrate by illuminating a laser beam onto the sealing member, the block pattern to provide for a more uniform heat distribution across a width of the sealing member during the bonding by being interposed between a laser source of the laser beam and the sealing member and by blocking a portion of the laser beam that corresponds to the central axes of the sealing member.

A width of the block pattern may be smaller than a width of the sealing member. The block pattern may include a plurality of metal patterns, and the metal patterns may be spaced-apart from each other by a predetermined distance. The metal patterns may have a shape selected from polygonal and circular. The block pattern and the conductive pattern may include a same material. The forming of the block pattern may include forming an inorganic layer having a transmittance of the laser beam of less than 90% onto the metal patterns to cover the metal patterns. The block pattern may include a plurality of inorganic patterns, and the inorganic patterns may be spaced-apart from each other by a predetermined distance. The inorganic patterns may have a shape selected from polygonal and circular. The inorganic patterns may be formed by patterning an inorganic layer of which a transmittance of the laser beam is below 90%. The protective layer may include an inorganic layer through which light is transmitted.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, the present inventive concept will be explained in detail with reference to the accompanying drawings.

Figure 1:
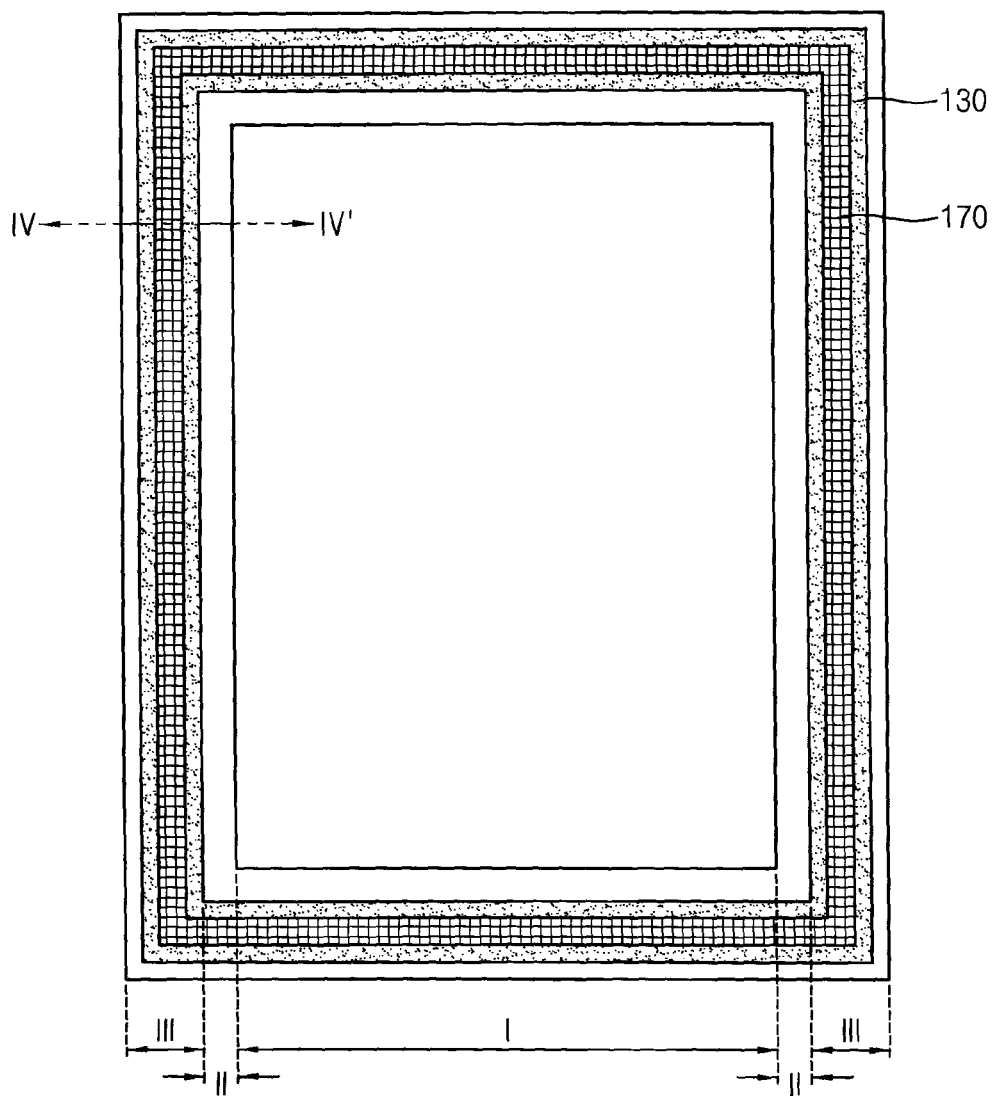
FIG. 1 is a plan view illustrating an organic light emitting display device according to example embodiments.
Figure 2:
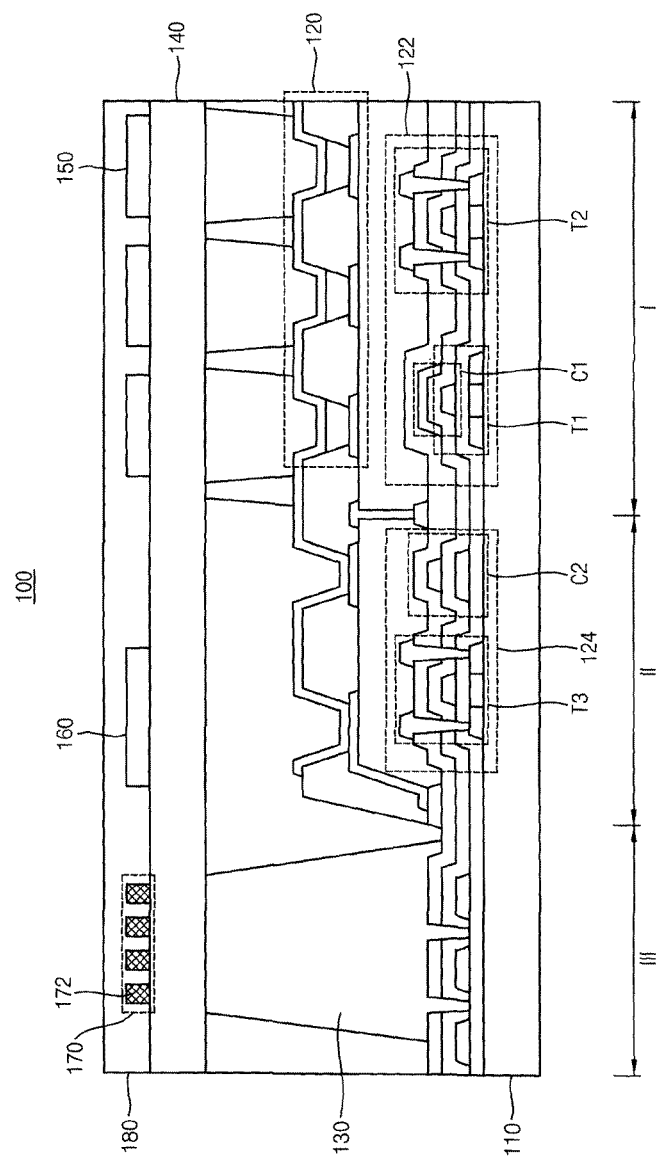
FIG. 2 is a cross-sectional view illustrating the organic light emitting display device of FIG. 1.

Turning now to FIGS. 1 and 2, FIG. 1 is a plan view illustrating an organic light emitting display device according to example embodiments and FIG. 2 is a cross-sectional view illustrating the organic light emitting display device of FIG. 1. Specifically, FIG. 2 is the cross-sectional view cut along line IV-IV' of FIG. 1.

Referring to FIGS. 1 and 2, an organic light emitting display (OLED) device 100 may include an emission region I, a circuit region II, and a peripheral region III. The emission region I may be arranged at a center of the OLED device 100. The emission region I may have a relatively large area. A plurality of pixels may be arranged in the emission region I. Each of the pixels may include an organic light emitting element 120 including a first electrode, a second electrode, and an organic light emitting structure. When the OLED device is an active type, each of the pixels may further include a pixel circuit 122 having thin film transistors electrically connected to the organic light emitting element 120. A peripheral circuit 124 and a wiring that provide electrical signals and power signals to the pixels may be arranged in the circuit region II. The circuit region II may be arranged between the emission region I and the peripheral region III. The circuit region II may surround at least three of the four sides of the emission region I. The circuit region II may contact the sides of the emission region I, however, the circuit region II may not overlap the emission region I. The peripheral region III may be a cell sealing region in which a sealing member 130 is arranged to encapsulate the organic light emitting element 120 and the pixel circuit 122 within the emission region I. The peripheral region III may be spaced-apart from the emission region I. The peripheral region III may surround all four sides of the emission region I.

In a curing process for curing the sealing member 130, laser radiation, which may be ultraviolet radiation, is irradiated upon a sealant to cure the sealant. The laser radiation may have a Gaussian shaped profile having a greater intensity at the center of the beam than at the edges of the beam. Consequently, a central axis of the sealing member is heated to a much higher temperature than edge portions of the sealing member. Furthermore, when the laser radiation may have a flat-top shaped profile, the temperature of the central axis of the sealing member may be measured higher than the temperature of the edge portions of the sealing member. This different heating and cooling rates at different locations across the width of the sealing member during the curing process produces a stress on the structure, as central portions along a central axis of the sealing member are heated to a much higher temperature and then cooled back down as compared to the edge portions of the sealing member. As a result, the mechanical strength of the sealing member and of the display device may be compromised due to the uneven heating across the width of the sealing member during the curing process.

To prevent this from happening, a block pattern 170 may be arranged above the center of the sealing member 130, and like the sealing member, may surround all four sides of the emission region I. The block pattern 170 may prevent a center of the sealing member 130 from being excessively illuminated by a laser beam during the curing process. Thus, the thermal energy may no longer be concentrated at the center of the sealing member 130, i.e., the thermal energy may be uniformly dispersed across a width of the sealing member 130. In some example embodiments, a width of the block pattern 170 may be smaller than a width of the sealing member 130.

Referring now to FIG. 2, the OLED device 100 may include a first substrate 110 and a second substrate 140 that face each other, the organic light emitting element 120 and the sealing member 130 being arranged between the first substrate 110 and the second substrate 140, and a sensing cell 150, a conductive pattern 160, a block pattern 170, and a protective layer 180 arranged on the second substrate 140.

The OLED device 100 may be divided into the emission region I, the circuit region II, and the peripheral region III. The pixel circuit 122 that includes a first transistor T1, a second transistor T2 and a first capacitor C1, and the organic light emitting element 120 may be arranged within the emission region I. The peripheral circuit 124 that includes a third transistor T3, a second capacitor C2 and the wiring may be arranged within the circuit region II. The sealing member 130 may be arranged within the peripheral region III. In some example embodiments, the first substrate 110 may be a hard substrate that includes hard materials such as glass, quartz, acryl, polycarbonate, etc. In other example embodiments, the first substrate 110 may be a flexible substrate that includes flexible materials such as epoxy, polyethylene terephtalate (PET), acryl, silicon, etc.

In the emission region I of the first substrate 110, the pixel circuit 122 that includes the first transistor T1, the second transistor T2, and the first capacitor C1, and the organic light emitting element 120 may be arranged. For example, each of the first transistor T1 and the second transistor T2 may have a top gate structure in which a gate insulation layer, a gate electrode, an insulating interlayer, and source/drain electrodes are arranged above an active pattern. A configuration of the first transistor T1 and the second transistor T2 is not limited thereto. For example, the first transistor T1 and the second transistor T2 may have a bottom gate structure in which a gate electrode is arranged under an active pattern. The first capacitor C1 may include a lower electrode, an upper electrode, and an insulating interlayer that is arranged between the lower electrode and the upper electrode. The organic light emitting element 120 may be arranged above the pixel circuit 122. The pixel circuit 122 may provide electrical signals to emit light from the organic light emitting element 120. The organic light emitting element 120 may include the first electrode, a pixel defining layer, the organic light emitting structure, and the second electrode.

In the circuit region II of the first substrate 110, the peripheral circuit 124 that includes the third transistor T3, the second capacitor C2, and the wiring may be arranged. The third transistor T3 may have a top gate structure in which a gate insulation layer, a gate electrode, an insulating interlayer, and source/drain electrodes are arranged above an active pattern, or may instead have a bottom gate structure in which a gate electrode is arranged under an active pattern. The second capacitor C2 may include a lower electrode, an upper electrode, and an insulating interlayer that is arranged between the lower electrode and the upper electrode.

An insulation layer 126 may be formed on the pixel circuit 122 and on the peripheral circuit 124. For example, the insulation layer 126 may include an insulating organic material such as polyimide. The insulation layer 126 may have a flat top surface in the emission region I and may partially cover the circuit region II. The organic light emitting element 120 may be electrically coupled to the pixel circuit 122 through a contact hole in the insulation layer 126.

In the peripheral region III of the first substrate 110, the sealing member 130 may be arranged and may include frit glass. The sealing member 130 may encapsulate the organic light emitting element 120 by bonding together the first substrate 110 and the second substrate 140. The sealing member 130 may encapsulate the organic light emitting element 120 by the curing process that heats and cures the sealing member 130 by illumination with the laser beam.

The second substrate 140 may be arranged to face the first substrate 110. The second substrate 140 may include a material substantially the same as or similar to that of the first substrate 110. The second substrate 140 may serve as an encapsulation substrate to cover the organic light emitting element 120 on the first substrate 110.

In the emission region I, the plurality of sensing cells 150 may be arranged on the second substrate 140. In the circuit region II, the conductive pattern 160 may be arranged on the second substrate 140. The sensing cells 150 and the conductive pattern 160 may constitute a touch panel. The sensing cells 150 may be dispersed within the emission region I. The sensing cells 150 may include transparent electrode material to transmit light emitted from the organic light emitting element 120 that is arranged under the sensing cells 150. For example, the sensing cells 150 may include the transparent electrode material, such as indium tin oxide (ITO), indium oxide, indium zinc oxide (IZO), tin oxide, zinc oxide, etc. The sensing cells 150 may be produced by depositing a first conductive layer on the second substrate 140 and pattering the first conductive layer. For example, the first conductive layer may be produced by a sputtering process, an atomic layer deposition (ALD) process, a pulse laser deposition (PLD) process, a vacuum evaporation process, etc.

The conductive pattern 160 may be arranged within the circuit region II, but a location in which the conductive pattern 160 is arranged is not limited thereto. The conductive pattern 160 may be arranged at any location on the second substrate 140 except the emission region I. The conductive pattern 160 may be electrically coupled to the sensing cells 150. Further, the conductive pattern 160 may be electrically coupled to an external driving circuit such as a position detecting circuit through a pad. The conductive pattern 160 may include low-resistance metal material such as molybdenum (Mo), silver (Ag), titanium (Ti), copper (Cu), aluminum (Al), molybdenum/aluminum/molybdenum (Mo/Al/Mo), etc. The conductive pattern 160 may be produced by depositing a second conductive layer on the second substrate 140 and then patterning the second conductive layer. For example, the second conductive layer may be produced by a sputtering process, an atomic layer deposition process, a pulse laser deposition process, a vacuum evaporation process, etc.

In the peripheral region III, the block pattern 170 may be arranged on the second substrate 140. The block pattern 170 may prevent the center of the sealing member 130 from being excessively illuminated by the laser beam during the curing process because the block pattern 170 is arranged above the sealing member 130 and between the sealing member 130 and the laser source. The width of the block pattern 170 may be smaller than the width of the sealing member 130. In some exemplary embodiments, the block pattern 170 may include a plurality of metal patterns 172. The metal patterns 172 may include metal material of which reflectivity is relatively low in order to prevent a laser beam device from damage that is occurred by reflecting laser beam from the metal patterns 172. When the block pattern 170 includes metal patterns 172, the metal patterns 172 may be concurrently formed with the conductive pattern 160.

An inorganic layer may be additionally formed on the metal patterns 172 to cover the metal patterns 172 to more effectively prevent the center of the sealing member 130 from being excessively illuminated by the laser beam. The inorganic layer may include inorganic materials of which transmittance of the laser beam is less than 90%. For example, the inorganic layer may be silicon oxide (SiOx) or silicon nitride (SiNx), of which transmittance of wavelengths of light (i.e. ultraviolet curing light) of the laser beam is less than 90%. In other example embodiments, the block pattern 170 may include a plurality of inorganic patterns 172. The inorganic patterns 172 may include inorganic materials of which transmittance of the laser beam is less than 90%. For example, the inorganic patterns 172 may include silicon oxide or silicon nitride, of which transmittance of the curing laser beam is less than 90%.

The protective layer 180 may be arranged to cover the sensing cells 150, the conductive pattern 160, and the block pattern 170 on the second substrate 140. The protective layer 180 may include an inorganic layer through which light is transmitted. For example, the protective layer 180 may include silicon oxide or silicon nitride as a material through which light is transmitted. The protective layer 180 may be produced by a chemical vapor deposition (CVD) process, a plasma enhanced chemical vapor deposition (PECVD) process, a high density plasma-chemical vapor deposition (HDP-CVD) process, etc.

As described above, the OLED device 100 may include the first substrate 110, the pixel circuit 122, the organic light emitting element 120, the sealing member 130, the second substrate 140, the sensing cells 150, the conductive pattern 160, the block pattern 170, and the protective layer 180. In the curing process to cure the sealing member 130 and thus encapsulate the organic light emitting element 120 arranged on the first substrate 110, the concentration of the thermal energy along the central axes of the sealing member 130 may be reduced by forming the block pattern 170 above the sealing member 130 between the sealing member 130 and the laser irradiation source. In some example embodiments, the block pattern 170 may include a plurality of metal patterns 172. The block pattern 170 that includes the metal patterns 172 may reduce the intensity of the laser beam that reaches portions of the sealing member 130 along a central symmetrical axes of the sealing member 130 during the curing process. Thus, an excessive concentration of thermal energy at the center of the sealing member 130 may be avoided.

In other example embodiments, the block pattern 170 may include an inorganic pattern 172 of which transmittance of the laser beam is less than 90%. The block pattern 170 that includes the inorganic patterns may absorb a portion of the laser beam that is illuminated onto the sealing member 130 during the curing process. Thus, the concentration of the thermal energy at the center of the sealing member 130 may be prevented.

Figure 3A:
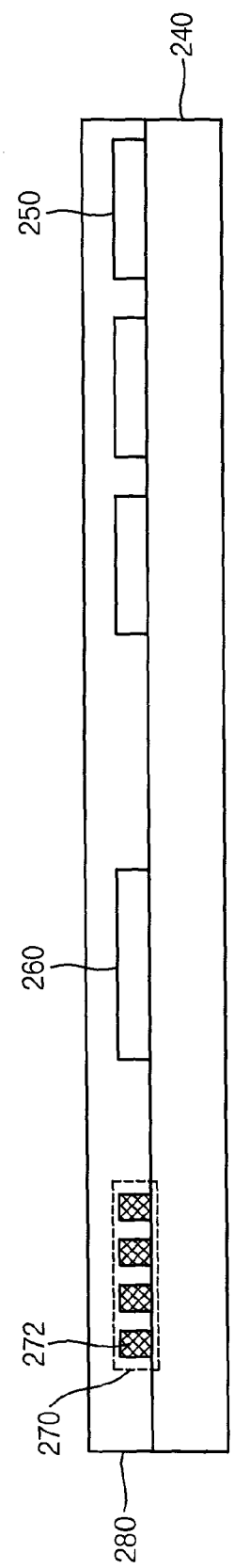
FIG. 3A is a cross-sectional view illustrating an example of a second substrate included in the organic light emitting display device of FIG. 1.
Figure 3B:
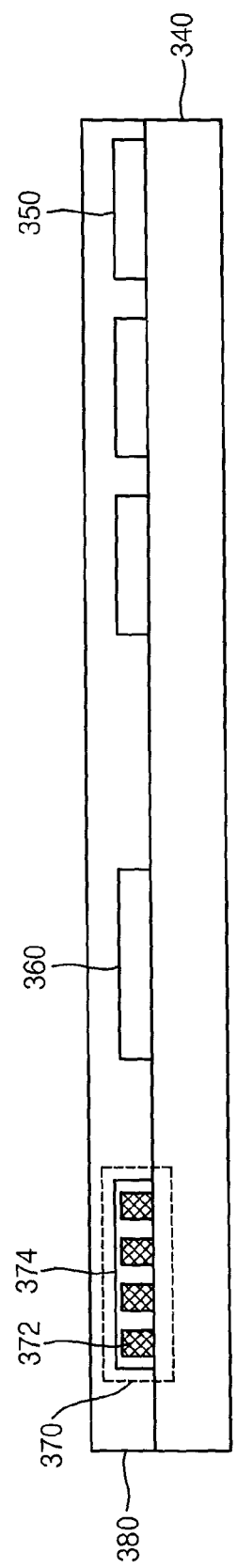
FIG. 3B is a cross-sectional view illustrating another example of a second substrate included in the organic light emitting display device of FIG. 1.

Turning now to FIGS. 3A and 3B, FIG. 3A is a cross-sectional view illustrating an example of a second substrate included in the organic light emitting display device of FIG. 1 and FIG. 3B is a cross-sectional view illustrating another example of a second substrate included in the organic light emitting display device of FIG. 1.

Referring to FIG. 3A, sensing cells 250, a conductive pattern 260, a block pattern 270, and a protective layer 280 may be arranged on a second substrate 240. The sensing cells 250 and the conductive pattern 260 may constitute a touch panel. The block pattern 270 may prevent a center of the sealing member from being overly illuminated by a laser beam during a curing process. The protective layer 280 may protect the sensing cells 250, the conductive pattern 260, and block pattern 270.

The sensing cells 250 may include transparent electrode material that transmits light emitted from the organic light emitting element on a side of the sensing cells 250 closest to the organic light emitting element. For example, the sensing cells 250 may include a transparent electrode material such as indium tin oxide, indium oxide, indium zinc oxide, tin oxide, zinc oxide, etc. The sensing cells 250 may be produced by forming a first conductive layer on the second substrate 240 and patterning the first conductive layer. For example, the first conductive layer may be produced by a sputtering process, an atomic layer deposition process, a pulse laser deposition process, a vacuum evaporation process, etc.

The conductive pattern 260 may include low-resistance metallic material that effectively transfers electric signals. For example, the conductive pattern 260 may include molybdenum, silver, titanium, copper, aluminum, molybdenum/aluminum/molybdenum, etc. The conductive pattern 260 may be produced by depositing a second conductive layer on the second substrate 240 and then patterning the second conductive layer. For example, the second conductive layer may be produced by a sputtering process, an atomic layer deposition process, a pulse laser deposition process, a vacuum evaporation process, etc.

Since the laser source for curing the sealant is emitted from a top side of the display device 100 above the protective layer 180, the block pattern 270 may be arranged above the sealing member 230. A width of the block pattern 270 may be smaller than a width of the sealing member 230. In some example embodiments, the block pattern 270 may include a plurality of metal patterns 272. The metal patterns 272 may include metal material of which reflectivity is relatively low in order to prevent a laser beam device from damage that is occurred by reflecting laser beam from the metal patterns 172. When the block pattern 270 includes the metal patterns 272, the metal patterns 272 may be concurrently produced with the conductive pattern 260.

The metal patterns 272 may be produced by forming a second conductive layer on the second substrate 240 and then patterning the second conductive layer. For example, the second conductive layer may be produced by a sputtering process, an atomic layer deposition process, a pulse laser deposition process, a vacuum evaporation process, etc. The block pattern 270 that includes the metal patterns 272 may prevent a thermal energy from being concentrated along a central axis of the sealing member by blocking and thus preventing a portion of the laser beam from reaching the central axis of the sealing member 230 during the curing process.

In other example embodiments, the block pattern 270 may include a plurality of inorganic patterns 272. The inorganic patterns 272 may include materials of which a transmittance about the laser beam is less than 90%. For example, the inorganic patterns 272 may include silicon oxide or silicon nitride of which the transmittance of the laser beam is less than 90%. The inorganic patterns 272 may be produced by forming a second inorganic layer on the second substrate 240 and then patterning the second inorganic layer. The block pattern 270 that includes the inorganic patterns 272 may prevent the thermal energy from being concentrated at the center of the sealing member by absorbing the laser beam that is illuminated at the center of the sealing member during the curing process.

Referring now to FIG. 3B, sensing cells 350, a conductive pattern 360, a block pattern 370, and a protective layer 380 may be formed on a second substrate 340. The sensing cells 350, the conductive pattern 360, and the protective layer 380 may be substantially the same as or similar to those of FIG. 3A. Thus, duplicated description will not be repeated. The block pattern 370 may include a plurality of metal patterns 372 and an inorganic layer 374 that covers the metal patterns 372. The metal patterns 372 may include metal material of which a reflectivity is relatively low in order to prevent a laser beam device from damage that is occurred by reflecting laser beam from the metal patterns 172. When the block patterns 370 includes the metal patterns 372, the metal patterns 372 may be concurrently produced with the conductive pattern 360. The metal pattern 370 may be produced by forming a second conductive layer on the second substrate 340 and patterning the second conductive layer. For example, the second conductive layer may be produced by the sputtering process, the atomic layer deposition process, the pulse laser deposition process, the vacuum evaporation process, etc.

The inorganic layer 374 may be arranged to cover the metal patterns 372. The inorganic layer 374 may include inorganic material of which a transmittance of the laser beam is less than 90%. For example, the inorganic layer 374 may be silicon oxide or silicon nitride, of which the transmittance about the laser beam is less than 90%. The inorganic layer 374 may be produced by depositing an inorganic layer on the second substrate 340 and then patterning the inorganic layer. Both the block pattern 370 that includes the metal patterns 372 and the inorganic layer 374 may prevent the thermal energy from being too concentrated along a central axis of the sealing member by attenuating or blocking a portion of the laser beam that is directed towards the central axis of the sealing member during the curing process.

Turning now to FIGS. 4A to 4D, FIGS. 4A to 4D are plan views of an edge or peripheral region of the organic light emitting display device of FIG. 1 illustrating examples of block patterns.

Figure 4A:
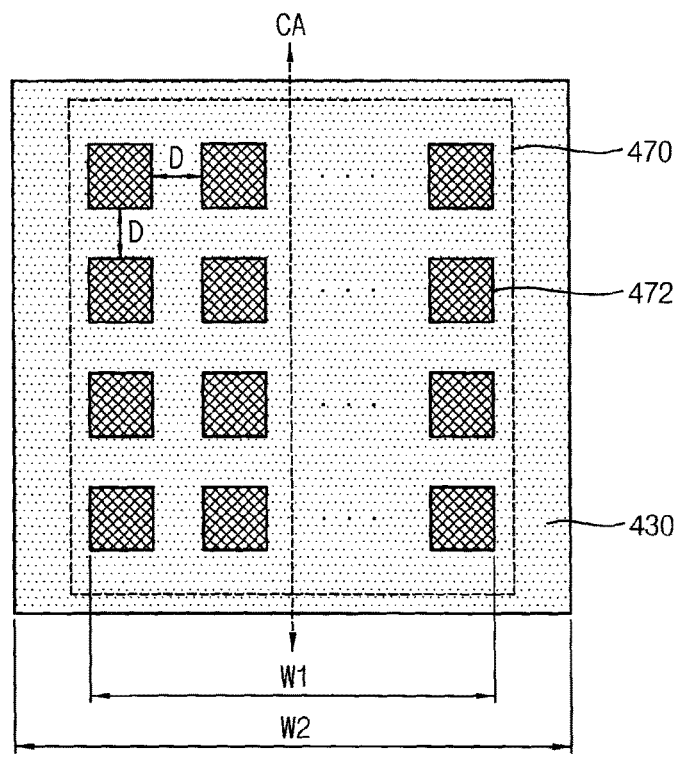
FIGS. 4A through 4D are plan views illustrating examples of a block pattern included in the organic light emitting display device of FIG. 1.

Referring now to FIG. 4A, a sealing member 430 may be arranged within the peripheral region III to surround all four sides of an emission region and have a predetermined width W2. A block pattern 470 may be arranged at a location that corresponds to the sealing member 430, and thus may be arranged above the sealing member 430 and also surround all four sides of the emission region I. The block pattern may also surround all four sides of the emission region. In some example embodiments, the block pattern 470 may include a plurality of metal patterns 472. In other example embodiments, the block pattern 470 may include a plurality of inorganic patterns 472.

As illustrated in FIG. 4A, a width W1 of the block pattern 470 may be smaller than the width W2 of the sealing member 430. The metal patterns 472 or the inorganic patterns 472 that are included within the block pattern 470 may be have a rectangular shape. Each of the metal patterns 472 or each of the inorganic patterns 472 may be spaced-apart from each other at a predetermined distance D. For example, the metal patterns 472 or the inorganic patterns 472 may be arranged in a rectangular lattice shape. As described above, a laser beam that is directed towards a central axes $C_A$ of the sealing member 430 may be prevented from overly exposing the central axes $C_A$ of the sealing member 430 by including the block pattern 470 above the central axes $C_A$ of the sealing member 430. Although the sealing member 430 and the block pattern 470 are depicted in FIG. 4A, a second substrate may be interposed between the sealing member 430 and the block pattern 470, and a protective layer that covers the block pattern 470 may be arranged on the block pattern 470.

Figure 4B:
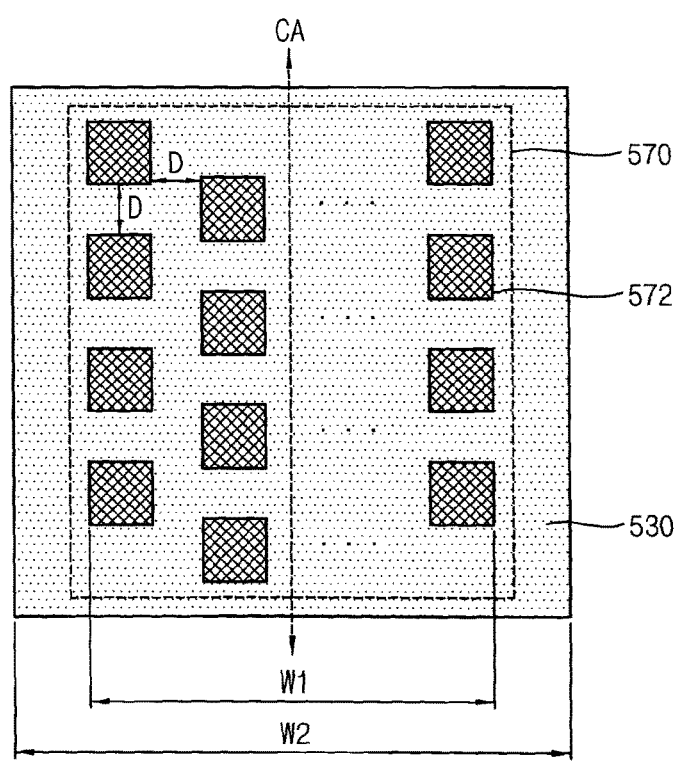

Referring now to FIG. 4B, a sealing member 530 may be arranged within the peripheral region III to surround all four sides of an emission region, and have a predetermined width W2. A block pattern 570 may be arranged above the sealing member 530 and also surround all four sides of the emission region I. In some example embodiments, the block pattern 570 may include a plurality of metal patterns 572. In other example embodiments, the block pattern 570 may include a plurality of inorganic patterns 572. As illustrated in FIG. 4B, a width W1 of the block pattern 570 may be smaller than the width W2 of the sealing member 530. The metal patterns 572 or the inorganic patterns 572 that are included in the block pattern 570 may have a rectangular shape. Each of the metal patterns 572 or each of the inorganic patterns 572 may be spaced-apart from each other by a predetermined distance D.

In the variation of FIG. 4B, the metal patterns 572 or the inorganic patterns 572 may be arranged in a zigzag or staggered arrangement. As described above, a laser beam that is directed towards a central axes $C_A$ of the sealing member 530 may be prevented from overly exposing and overly heating the central axis $C_A$ portion of the sealing member 530 during the curing process by including the block pattern 570 above (and on an incident side of) the central axes $C_A$ of the sealing member 530. Although the sealing member 530 and the block pattern 570 are depicted in FIG. 4B, a second substrate may be interposed between the sealing member 530 and the block pattern 570, and a protective layer that covers the block pattern 570 may be arranged on the block pattern 570.

Figure 4C:
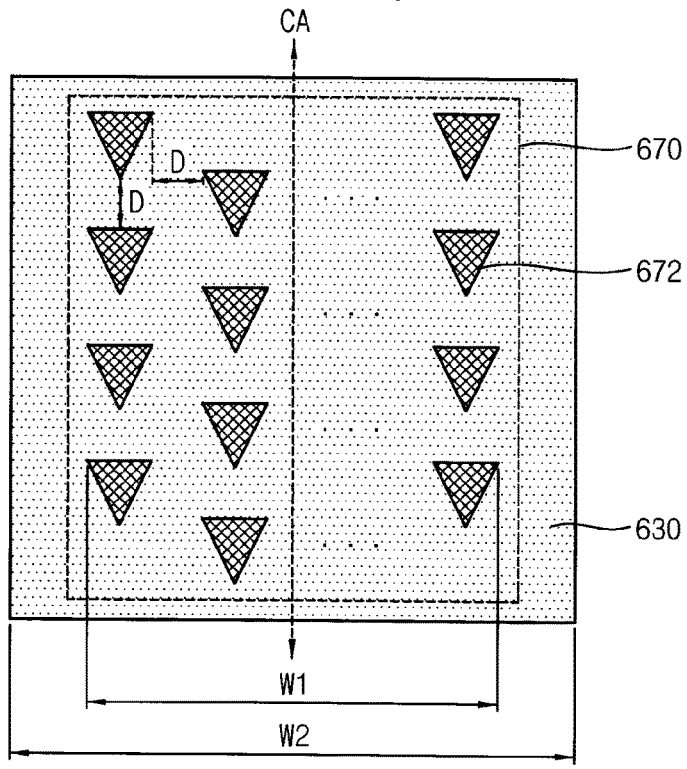

Referring now to FIG. 4C, a sealing member 630 may be arranged within a peripheral region III to surround all four sides of an emission region I and have a predetermined width W2. A block pattern 670 may be arranged above the sealing member 630 to be on an incident side of the sealing member and also surround all four sides of the emission region I. In some example embodiments, the block pattern 670 may include a plurality of metal patterns 672. In other example embodiments, the block pattern 670 may include a plurality of inorganic patterns 672. As illustrated in FIG. 4C, a width W1 of the block pattern 670 may be smaller than the width W2 of the sealing member 630.

In the variation of FIG. 4C, the metal patterns 672 or the inorganic patterns 672 that are included within the block pattern 670 may have a triangular shape. Each of the metal patterns 672 or each of the inorganic patterns 672 may be spaced-apart from each other by a predetermined distance D. For example, the metal patterns 672 or the inorganic patterns 672 may be arranged in a zigzag or staggered arrangement. As described above, a laser beam that illuminates and cures the sealing member 630 may be prevented from overheating a central axis $C_A$ of the sealing member 630 by including the block pattern 670 in the vicinity of the central axis $C_A$ of the sealing member 630. Although the sealing member 630 and the block pattern 670 are depicted in FIG. 4C, a second substrate may be interposed between the sealing member 630 and the block pattern 670, and a protective layer that covers the block pattern 670 may be arranged on the block pattern 670.

Figure 4D:
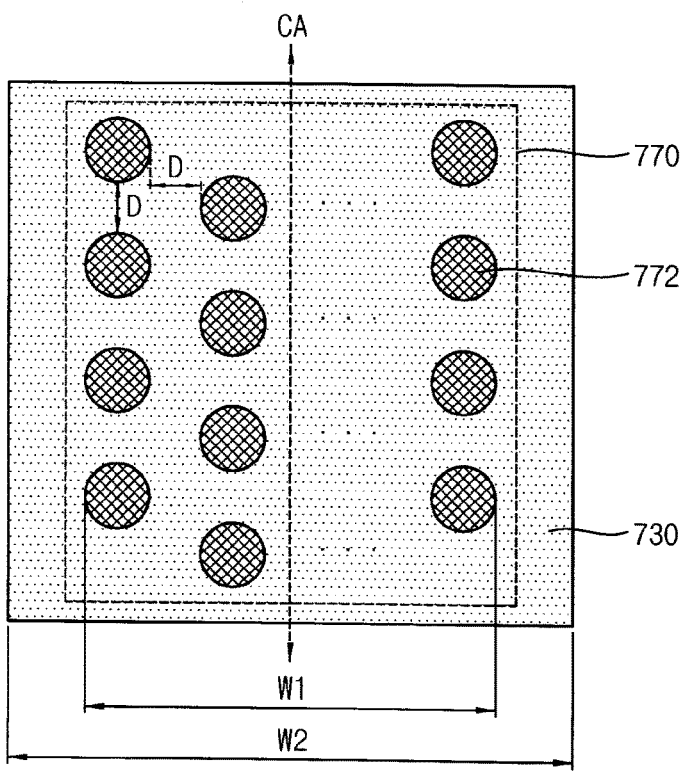

Referring now to FIG. 4D, a sealing member 730 may be arranged within a peripheral region III to surround all four sides of an emission region I and have a predetermined width W2. A block pattern 770 may be formed above the sealing member 730 and also surround all four sides of the emission region I. In some example embodiments, the block pattern 770 may include a plurality of metal patterns 772. In other example embodiments, the block pattern 770 may include a plurality of inorganic patterns 772. As illustrated in FIG. 4D, a width W1 of the block pattern 770 may be smaller than the width W2 of the sealing member 730.

In the variation of FIG. 4D, the metal patterns 772 or the inorganic patterns 772 that are included in the block pattern 770 may have a circular shape. Each of the metal patterns 772 or each of the inorganic patterns 772 may be spaced-apart from each other by a predetermined distance D. For example, the metal patterns 772 or the inorganic patterns 772 may be arranged in a zigzag or staggered arrangement. As described above, a laser beam that illuminates the sealing member 730 will not overheat the central axes $C_A$ of the sealing member 730 by including the block pattern 770 above (and on an incident side of) the central axes $C_A$ of the sealing member 730. Although the sealing member 730 and the block pattern 770 are depicted in FIG. 4D, a second substrate may be interposed between the sealing member 730 and the block pattern 770, and a protective layer that covers the block pattern 770 may be arranged on the block pattern 770.

Figure 5:
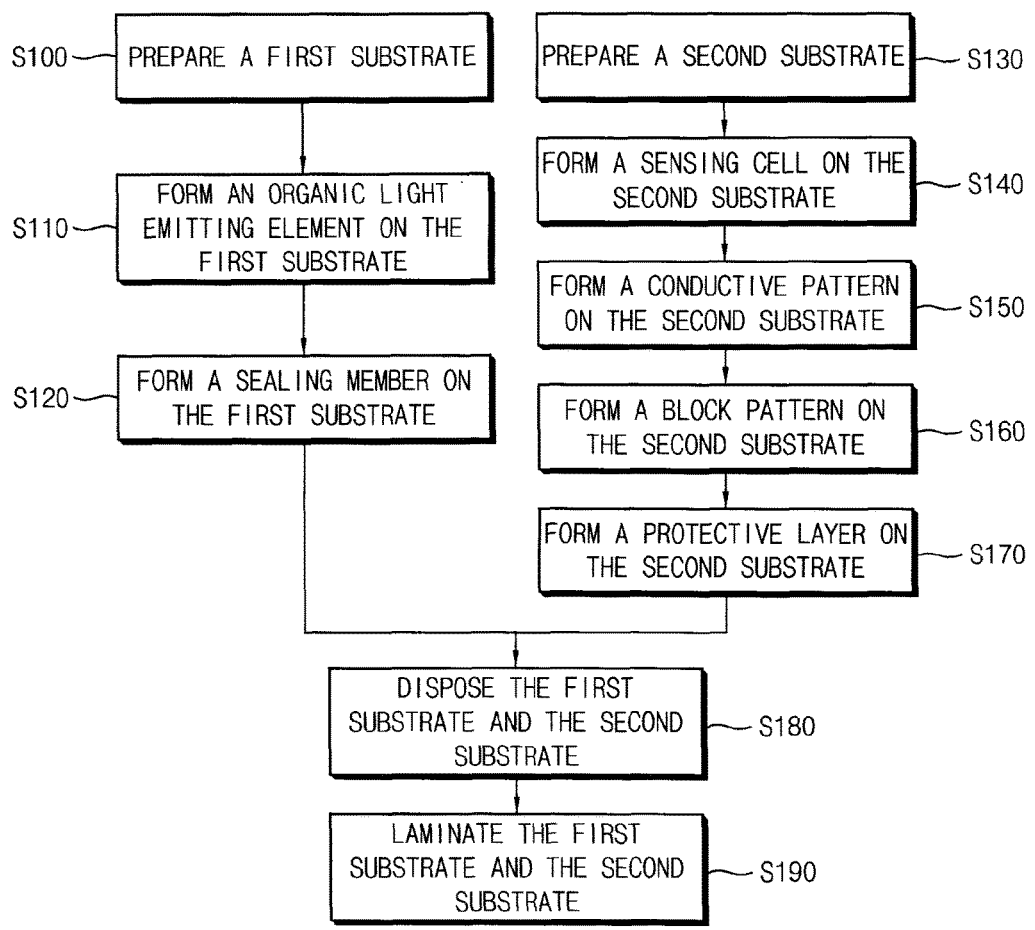
FIG. 5 is a flow chart illustrating a method of manufacturing an organic light emitting display device according to example embodiments.

Turning now to FIG. 5, FIG. 5 is a flow chart illustrating a method of manufacturing an organic light emitting display device according to example embodiments and FIGS. 6 through 12 are cross-sectional views illustrating an organic light emitting display device that is manufactured by the method of FIG. 5.

Referring now to FIGS. 5 through 12, the method of FIG. 5 may prepare a first substrate 810 (S100), may form an organic light emitting element 820 in an emission region I on the first substrate 810 (S110), and may form a sealing member 830 in a peripheral region III on the first substrate 810 (S120). The method of FIG. 5 may prepare a second substrate 840 (S130) and may form a sensing cell 850 on the second substrate 840 (S140). The method of FIG. 5 may form a conductive pattern 860 on the second substrate 840 (S150), may form a block pattern 870 on the second substrate 840 (S160), and may form a protective layer 880 on the second substrate 840 to cover the sensing cell 850, the conductive pattern 860, and the block pattern 870 (S170). The method of FIG. 5 may arrange the second substrate 840 to face the first substrate 810 (S180) and may bond together the first substrate 810 the second substrate 840 by illuminating a laser beam onto the sealing member 830 (S190).

Figure 6:
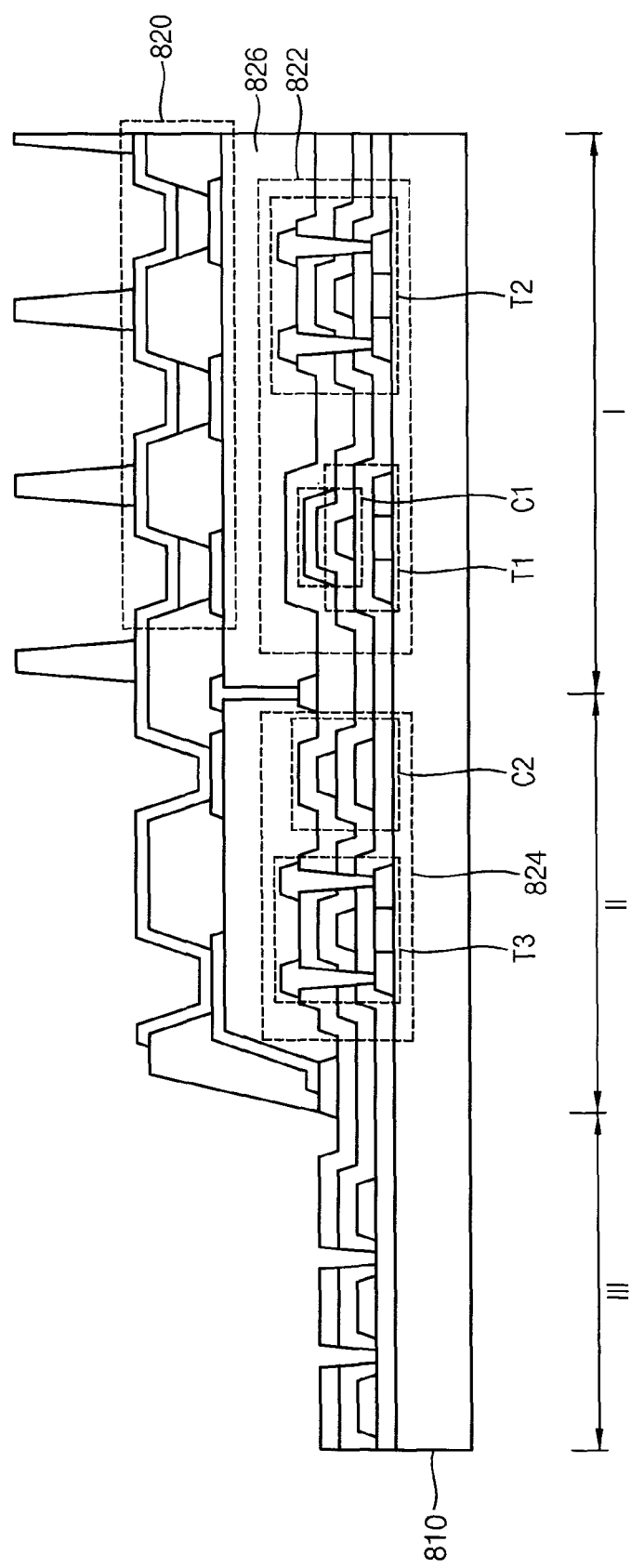
FIGS. 6 through 12 are cross-sectional views illustrating an organic light emitting display device is manufactured by the method of FIG. 5.

Referring now to FIG. 6, the first substrate 810 may be prepared (S100). In some example embodiments, the first substrate 810 may be a hard substrate that includes hard materials such as glass, quartz, acryl, polycarbonate, etc. In other example embodiments, the first substrate 810 may instead be a flexible substrate that includes flexible materials such as epoxy, polyethylene terephtalate, acryl, silicon, etc. The first substrate 810 may include the emission region I, a circuit region II that surrounds the emission region I, and the peripheral region III that surrounds the circuit region II.

The organic light emitting element 820 may be formed on the first substrate 810 in the emission region I (S110). A pixel circuit 822 may be formed on the first substrate 810 in the emission region I, and a peripheral circuit 824 may be formed on the first substrate 810 in the circuit region II. The organic light emitting element 820 may be formed above the pixel circuit 822. The pixel circuit 822 may include a first transistor T1, a second transistor T2, and a first capacitor C1. The peripheral circuit 824 may include a third transistor T3 and a second capacitor C2. Each of the first transistor T1, the second transistor T2, and the third transistor T3 may be produced by laminating an active pattern, a gate insulation layer, a gate electrode, an insulation interlayer, and source/drain electrodes. Further, each of the first capacitor C1 and the second capacitor C2 may be produced by laminating a lower electrode, the insulating interlayer, and an upper electrode. An insulation layer 826 may be formed on the pixel circuit 822 and on the peripheral circuit 824. For example, the insulation layer 826 may include an insulating organic material such as polyimide. The insulation layer 826 may have a flat top surface in the emission region I and may partially cover the circuit region II. The organic light emitting element 820 may be electrically coupled to the pixel circuit 822 through a contact hole in the insulation layer 826. The organic light emitting element 820 may be produced by laminating a first electrode, a pixel defining layer, an organic light emitting structure, and a second electrode. A spacer 829 may also be formed above the organic light emitting element 820 to maintain a gap between the first substrate 810 and the second substrate 840.

Figure 7:
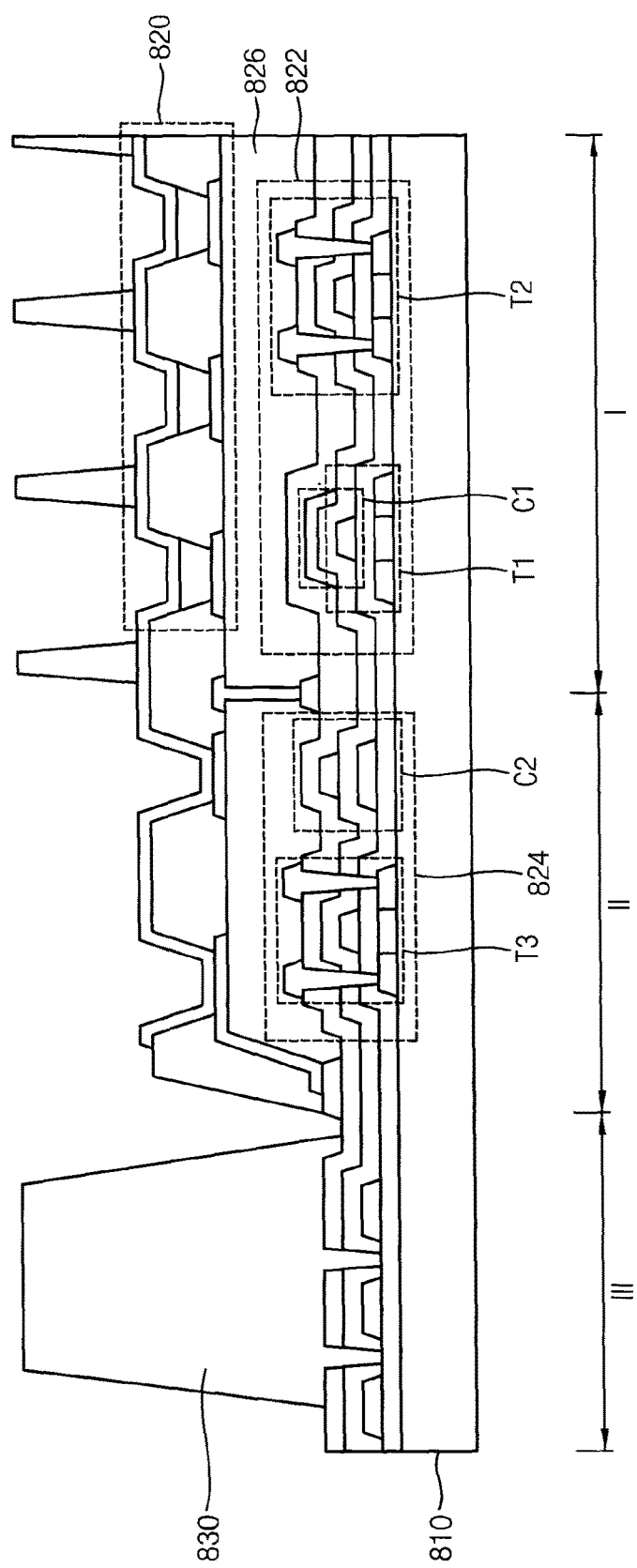

Referring now to FIG. 7, the sealing member 830 may be formed on the first substrate 810 within the peripheral region III (S120). The sealing member 830 may be arranged on the first substrate 810 and within the peripheral region III and may include a glass frit. The sealing member 830 may encapsulate the organic light emitting element 820 that is arranged within the emission region I by bonding together the first substrate 810 and the second substrate 840. The sealing member 830 may encapsulate the organic light emitting element 820 upon a curing process that heats and cures the sealing member 830 by exposure to a laser beam.

Figure 8:
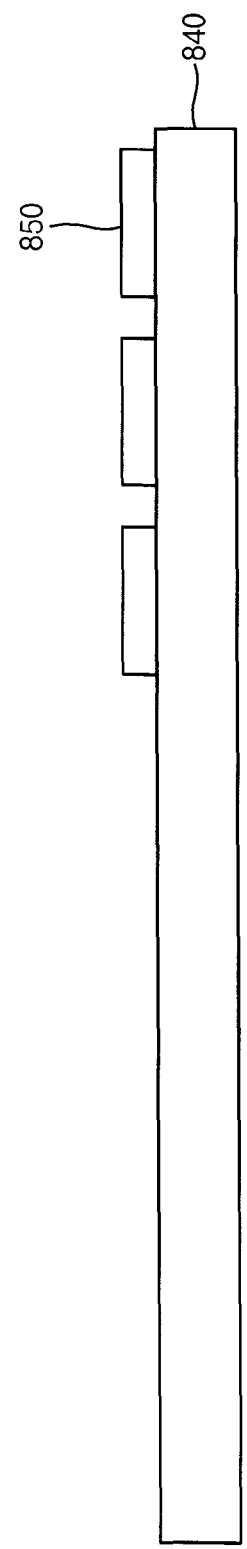

Referring now to FIG. 8, the second substrate 840 may be prepared (S130). The second substrate 840 may include a material that is substantially the same as or similar to that of the first substrate 810. The second substrate 840 may serve as an encapsulation substrate to cover the organic light emitting element 820 on the first substrate 810.

The sensing cells 850 may be formed on the second substrate 840 (S140). The sensing cells 850 may be formed above the organic light emitting element 820, i.e., the sensing cells 850 may be arranged at a location that corresponds to the emission region I of the first substrate 810. The sensing cells 850 may include transparent electrode material that transmits light emitted from the organic light emitting element 820 arranged under the sensing cells 850. For example, the sensing cells 850 may include the transparent electrode material such as indium tin oxide, indium oxide, indium zinc oxide, tin oxide, zinc oxide, etc. The sensing cells 850 may be produced by depositing a first conductive layer on the second substrate 840 and then patterning the first conductive layer. For example, the first conductive layer may be produced by a sputtering process, an atomic layer deposition process, a pulse laser deposition process, a vacuum evaporation process, etc.

Figure 9:
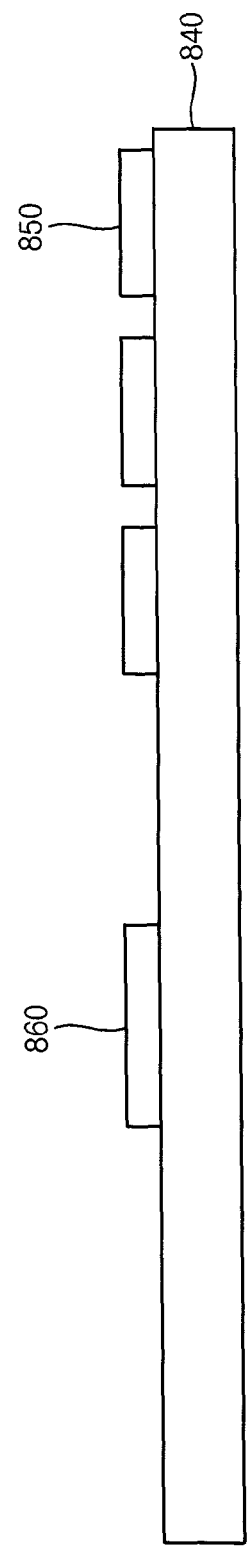

Referring now to FIG. 9, the conductive pattern 860 may be formed on the second substrate 840 (S150). The conductive pattern 860 may be formed above the peripheral circuit 824, i.e., the conductive pattern 860 may be arranged at a location that corresponds to the circuit region II of the first substrate 810, however a location in which the conductive pattern 860 is arranged is not limited thereto. The conductive pattern 860 may include a low-resistance metal material that effectively transfers electric signals. For example, the conductive layer may include molybdenum, silver, titanium, copper, aluminum, molybdenum/aluminum/molybdenum, etc. The conductive pattern 860 may be produced by depositing a second conductive layer on the second substrate 840 and then patterning the second conductive layer. For example, the second conductive layer may be produced by a sputtering process, an atomic layer deposition process, a pulse laser deposition process, a vacuum evaporation process, etc.

Figure 10:
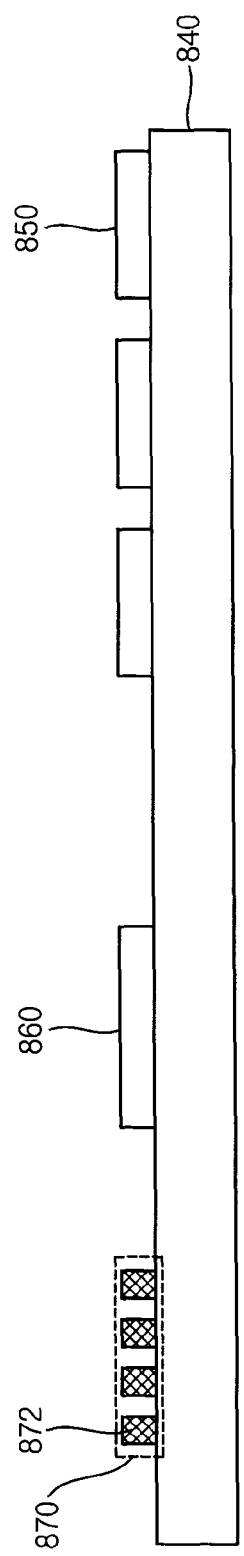

Referring now to FIG. 10, the block pattern 870 may be formed on the second substrate 840 (S160). The block pattern 870 may be formed above the sealing member 830, i.e., so that the block pattern 870 is arranged at a location that corresponds to the peripheral region III of the first substrate 810. A width of the block pattern 870 may be smaller than a width of the sealing member 830. The block pattern 870 serves to prevent a central portion of the sealing member 830 from receiving too much laser radiation and from becoming too hot during the curing process.

In some example embodiments, the block pattern 870 may include a plurality of metal patterns 872. The metal patterns 872 may be spaced-apart from each other by a predetermined distance. Further, each of the metal patterns 872 may have a polygonal shape or a circular shape. The metal patterns 872 may include metallic materials of which a reflectivity is relatively low in order to prevent a laser beam device from damage that is occurred by reflecting laser beam from the metal patterns 172.

When the block pattern 870 includes the metal patterns 872, the metal patterns 872 may include the same material as the conductive pattern 860. Further, the metal patterns 872 may be formed concurrently with the formation of the conductive pattern 860, and thus steps S150 and S160 of FIG. 5 can be combined into a single process step. The metal patterns 872 may be produced by depositing the second conductive layer on the second substrate 840 and then patterning the second conductive layer. For example, the second conductive layer may be produced by the sputtering process, the atomic layer deposition process, the pulse laser deposition process, the vacuum evaporation process. The block pattern 870 that includes the metal patterns 872 may prevent thermal energy from being concentrated at the central portion of the sealing member 830 by blocking a portion of the laser beam during the curing process.

In other example embodiments, the block pattern 870 may include a plurality of inorganic patterns 872. The inorganic patterns 872 may be spaced-apart from each other by a predetermined distance. Further, each of the inorganic patterns 872 may have a polygonal shape or a circular shape. The inorganic patterns 872 may include inorganic materials having a transmittance that is less than 90% for a wavelength of the curing laser beam. For example, the inorganic patterns 872 may include silicon oxide or silicon nitride, of which the transmittance the curing laser beam is less than 90%.

The inorganic pattern 872 may be produced by depositing an inorganic layer on the second substrate 840 and then patterning the inorganic layer, and thus may constitute a separate process step from the formation of the conductive pattern from the second conductive layer. For example, the inorganic layer may be produced by a sputtering process, an atomic layer deposition process, a chemical vapor deposition process, etc. The block pattern 870 that includes inorganic patterns 872 may prevent thermal energy from being too concentrated at the central portion of the sealing member 830 by absorbing a portion of the laser beam during the curing process.

In other example embodiments, the block pattern 870 may include both the metal patterns 872 and an inorganic layer that covers the metal patterns 872. The metal patterns 872 may be spaced-apart from each other by a predetermined distance. Further, each of the metal patterns 872 may have a polygonal shape or a circular shape. The metal patterns 872 may include metal materials of which the transmittance is relatively low. The inorganic layer that covers the metal patterns 872 may include inorganic materials of which the transmittance of the laser beam is below 90%. The block pattern 870 that include the metal patterns 872 and the inorganic layer that covers the metal patterns 872 may prevent thermal energy from being too concentrated along the central axis of the sealing member 830 by attenuating, blocking and/or absorbing the laser beam during the curing process.

Figure 11:
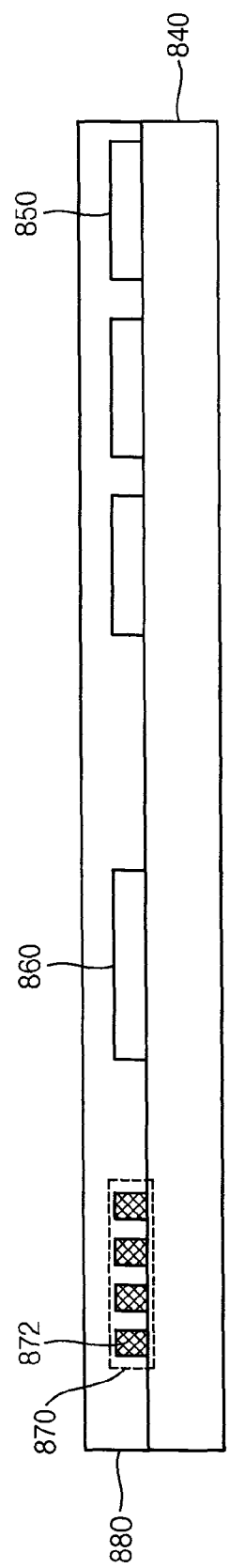

Referring now to FIG. 11, the protective layer 880 that covers the sensing cells 850, the conductive pattern 860, and the block pattern 870 may be formed on the second substrate 840 (S170). The protective layer 880 may be formed to cover the sensing cells 850, the conductive pattern 860, and the block pattern 870. The protective layer 880 may include an inorganic layer through which light transmits. For example, the protective layer 880 may include silicon oxide or silicon nitride as material through which light is transmitted. The protective layer 880 may be produced by a chemical vapor deposition process, a plasma enhanced vapor deposition process, a high density plasma chemical vapor deposition process, etc.

Figure 12:
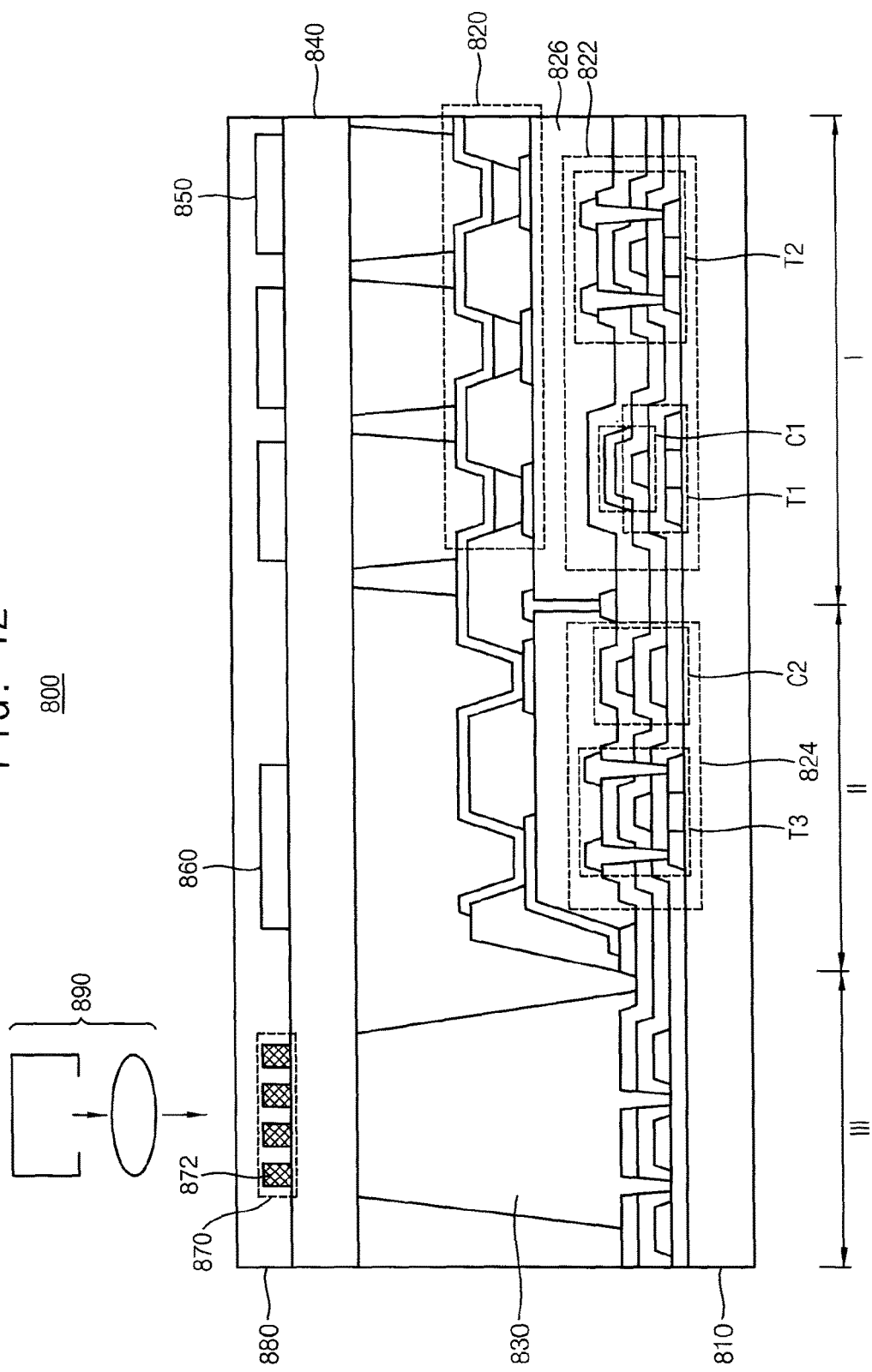

Referring now to FIG. 12, the second substrate 840 may be arranged to face the first substrate 810 (S180). A region of the second substrate 840 on which the sensing cells 850 are arranged may be corresponded to the emission region I of the first substrate 810, a region of the second substrate 840 on which the conductive pattern 860 is arranged may be corresponded to the circuit region II of the first substrate 810, and a region of the second substrate 840 on which the block pattern 870 is arranged may be corresponded to the peripheral region III of the first substrate 810. Also the substrates are to be arranged so that the block pattern 870 corresponds to (i.e. is arranged above) the sealing member 830 and is centered about the central axes of the sealing member 830. Further, the width of the block pattern 870 may be smaller than the width of the sealing member 830.

The first substrate 810 and the second substrate 840 may be bonded together by illuminating the laser beam onto the sealing member 830 (S190). As illustrated in FIG. 12, the laser irradiation source 890 is arranged on an external side of the second substrate 840 so that the block pattern 870 is interposed between the laser irradiation source 890 and the sealing member 830. As a result, laser radiation emanating from the laser source 890 must first travel through block pattern 870 before reaching curing member 830. Because the laser beam emanating from the laser source 890 may not have a uniform cross-sectional intensity profile, an excessive amount of light and heat would ordinarily concentrate along the central axes of the sealing member 830 during the curing process, thereby causing mechanical stress about the sealing member 830 due to the differing heating and cooling rates with location, and thereby limiting the mechanical strength of the seal and the display. In the present invention, this concentration of heat and light about the central axes of the sealing member 830 is avoided by including a blocking member 870 interposed between the laser source 890 and the sealing member 830 to attenuate or block a portion of the central portion of the laser beam. As described above, the block pattern 870 may prevent thermal energy from being excessively concentrated near and along the central axes of the sealing member 830. The result is a sealing member 830 with improved mechanical strength that undergoes less stress during the curing process. Thus, a mechanical strength of the OLED device 800 may be enhanced.

As described above, the method of FIG. 5 may form the organic light emitting element 820 and the sealing member 830 on the first substrate 810 and may form the sensing cells 850, the conductive pattern 860, the block pattern 870, and the protective layer 880 on the second substrate 840. Further, the method of FIG. 5 may bond together the first substrate 810 and the second substrate 840 during the curing process, where a laser beam illuminates the sealing member 830 to cure the sealing member 830. A portion of the laser beam that is illuminated along the central axes of the sealing member 830 during the curing process may be attenuated, blocked and/or absorbed the block pattern 870 that is arranged above the sealing member 830. Thus, the method of FIG. 5 may prevent excessive thermal energy from being concentrated along the central axes of the sealing member 830. Therefore, the mechanical strength of the OLED device 800 may be enhanced and the mechanical stress incurred about the sealing member 830 during the curing process may be reduced.

The present inventive concept may be applied to an electronic device having an OLED device. For example, the present inventive concept may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic tight emitting display (OLEO) device, comprising:
   a first substrate including an emission region, a peripheral region that surrounds a circuit region, the circuit region being arranged between the emission region and the peripheral region, the peripheral region being spaced apart from the emission region by the circuit region;
   a second substrate facing the first substrate;
   an organic light emitting element arranged within the emission region of the first substrate;
   a sealing member arranged within the peripheral region of the first substrate and configured to bond together the first substrate and the second substrate upon being cured by a laser beam;
   a sensing cell arranged on the second substrate at a location that corresponds to organic light emitting element;
   a conductive pattern arranged on the second substrate at a location that corresponds to the circuit region;
   a block pattern arranged on the second substrate at locations that correspond to the sealing member; and
   a protective layer covering the sensing cell, the conductive pattern, and the block pattern on the second substrate,
   wherein the block pattern and the conductive pattern are comprised of a same material selected from a group consisting of molybdenum, silver, titanium, copper, aluminum, molybdenum/aluminum/molybdenum, and
   wherein the sensing cell is comprised of a material selected from a group consisting of indium tin oxide, indium oxide, indium zinc oxide, tin oxide, zinc oxide.

2. The OLED device of claim 1, wherein a width of the block pattern is smaller than a width of the sealing member, the width of the block pattern being orthogonal to a closest central axis of the sealing member.

3. The OLED device of claim 1, wherein the block pattern includes a plurality of metal patterns that each have a same size and a same shape, the metal patterns being spaced-apart from each other by a same predetermined distance.

4. The OLEO device of claim 1, wherein the protective layer being produced by a process selected from a group consisting of chemical vapor deposition, plasma enhanced chemical vapor deposition and high density plasma-chemical vapor deposition, the protective layer being comprised of a material selected from silicon oxide and silicon nitride.

5. The OLED device of claim 1, wherein the block pattern and the conductive pattern are concurrently formed.

6. The OLED device of claim 3, wherein the block pattern further includes an inorganic layer that covers the metal patterns, and a transmittance of the inorganic layer is less than 90%.

7. The OLED device of claim 1, wherein the block pattern includes a plurality of inorganic patterns, and the inorganic patterns are spaced-apart from each other by a predetermined distance, wherein the block pattern is produced by patterning an inorganic layer that has a transmittance of less than 90%.

8. The OLED device of claim 1, wherein the block pattern comprises an inorganic material selected from silicon oxide (SiOx) and silicon nitride (SiNx) and has a transmittance of less than 90%.

9. The OLED device of claim 5, wherein the block pattern, the sensing cell and the conductive pattern are all arranged on a side of the second substrate opposite from that of the first substrate, wherein the sensing cell is comprised of a material selected from a group consisting of indium tin oxide, indium oxide, indium zinc oxide, tin oxide and zinc oxide.

10. The OLED device of claim 1, wherein a width of the block pattern is smaller than a width of the sealing member, wherein the block pattern includes a plurality of metal patterns, wherein a pattern density of the metal patterns is uniform across the width of the block pattern, the width of the block pattern being orthogonal to a closest central axis of the sealing member.

11. A method of manufacturing an organic light emitting display (OLED) device, comprising:
    preparing a first substrate that includes an emission region, a peripheral region that surrounds a circuit region, the circuit region being arranged between the emission region and the peripheral region, the peripheral, region being spaced apart from the emission region by the circuit region;
    forming an organic light emitting element within the emission region of the first substrate;
    forming a sealing member within the peripheral region of the first substrate on all four sides of the emission region;
    preparing a second substrate;
    forming a sensing cell on the second substrate at a location that corresponds to organic light emitting element;
    forming a conductive pattern on the second substrate at a location that corresponds to the circuit region;
    forming a block, pattern on the second substrate at a location that corresponds to the sealing, member on all four sides of the emission region;
    forming a protective layer on the second substrate to cover the sensing, cell, the conductive patter, and the block pattern;
    arranging the second substrate to face the first substrate; and
    bonding together the first substrate and the second substrate by illuminating a laser beam onto the sealing member, the block pattern to provide for a more uniform heat distribution across a width of the sealing member during the bonding by being interposed between a laser source of the laser beam and the sealing member and by blocking a portion of the laser beam that corresponds to the central axes of the sealing member,
    wherein the block pattern and the conductive pattern are comprised of a same material selected from a group consisting of molybdenum, silver, titanium, copper, aluminum, molybdenum/aluminum/molybdenum,
    wherein the sensing cells are comprised of a material selected from a group consisting of indium tin oxide, indium oxide, indium zinc oxide, tin oxide, zinc oxide.

12. The method of claim 11, wherein a width of the block pattern is smaller than the width of the sealing member, the width of the block pattern being orthogonal to a closest one of the central axes of the sealing member.

13. The method of claim 11, wherein the block pattern includes a plurality of metal patterns that each have a same size and a same shape, the metal patterns are spaced-apart from each other by a same predetermined distance.

14. The method of claim 11, wherein the forming of the conductive pattern occurs simultaneously to the forming of the block pattern, wherein the forming of the sensing cells occurs prior to the forming of the conductive pattern and the forming of the block pattern.

15. The method of claim 13, wherein the forming, of the block pattern includes forming an inorganic layer having a transmittance of the laser beam of less than 90% onto the metal patterns to cover the metal patterns.

16. The method of claim 11, wherein the block pattern includes a plurality of inorganic patterns, and the inorganic patterns are spaced-apart from each other by a predetermined distance, wherein the block pattern is produced by patterning an inorganic layer that has a transmittance of less than 90%.

17. The method of claim 11, wherein the block patient comprises an inorganic, material selected from silicon oxide (SiOx) and silicon nitride (SiNx) and has a transmittance of less than 90%.

18. The method of claim 11, wherein the block pattern, the conductive pattern and the sensing cell are all formed on a side of the second substrate opposite from that of the first substrate.

19. The method of claim 11, wherein a width of the block pattern is smaller than a width of the sealing member, wherein the block pattern includes a plurality of metal patterns, wherein a pattern density of the metal patterns is uniform across the width of the block pattern, the width of the block pattern being orthogonal to a closest one of the central axes of the sealing member.

20. The OLED device of claim 1, wherein block pattern and the sealing member are arranged on all four sides of the emission region,
   wherein the block pattern prevents central axes of the sealing member from receiving more laser radiation than other portions of the sealing member during a curing process by blocking a portion of incident laser radiation directed towards the central axes of the sealing member.

* * * * *